(12) United States Patent
Jiang et al.

(10) Patent No.: US 9,917,203 B2
(45) Date of Patent: Mar. 13, 2018

(54) THIN FILM TRANSISTOR, MANUFACTURING METHOD THEREOF, ARRAY SUBSTRATE AND DISPLAY APPARATUS

(71) Applicant: BOE TECHNOLOGY GROUP CO., LTD., Beijing (CN)

(72) Inventors: Chunsheng Jiang, Beijing (CN); Lung Pao Hsin, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 93 days.

(21) Appl. No.: 14/770,369

(22) PCT Filed: Nov. 21, 2014

(86) PCT No.: PCT/CN2014/091912
§ 371 (c)(1),
(2) Date: Aug. 25, 2015

(87) PCT Pub. No.: WO2016/019654
PCT Pub. Date: Feb. 11, 2016

(65) Prior Publication Data
US 2016/0043228 A1    Feb. 11, 2016

(30) Foreign Application Priority Data

Aug. 5, 2014    (CN) .......................... 2014 1 0381242

(51) Int. Cl.
*H01L 21/00*      (2006.01)
*H01L 29/786*    (2006.01)
(Continued)

(52) U.S. Cl.
CPC .... *H01L 29/7869* (2013.01); *H01L 21/02565* (2013.01); *H01L 21/425* (2013.01);
(Continued)

(58) Field of Classification Search
CPC ............. H01L 21/02565; H01L 21/425; H01L 21/441; H01L 27/1225; H01L 29/0684;
(Continued)

(56) References Cited

U.S. PATENT DOCUMENTS 5,581,092 A    12/1996  Takemura
7,988,470 B2 *  8/2011  Ye ..................... H01L 29/78606
                                                    257/E21.231
(Continued)

FOREIGN PATENT DOCUMENTS

CN        103855194 A    6/2014
CN        103872138 A    6/2014
JP        2007-311453 A  11/2007

OTHER PUBLICATIONS

Lee et al., "Nanocrystalline ZnON; High mobility and low band gap semiconductor material for high performance switch transistor and image sensor application", Scientific Reports (2014) pp. 1-7.*
(Continued)

*Primary Examiner* — Jay C Kim
(74) *Attorney, Agent, or Firm* — Collard & Rose, P.C.

(57) ABSTRACT

A thin film transistor, a manufacturing method thereof, an array substrate and a display apparatus are disclosed. The manufacturing method includes forming a gate electrode (2), a gate insulating layer (3), an active region (4), a source electrode (5) and a drain electrode (6) on a base substrate (1) with the active region being formed of ZnON material, and implanting the active region (4) with nitrogen ion while it being formed, so as to make the sub-threshold swing amplitude of the thin film transistor less than or equal to 0.5 mV/dec. The manufacturing method reduces the sub-threshold swing amplitude of the thin film transistor and improves the semiconductor characteristics of the thin film transistor.

4 Claims, 2 Drawing Sheets

(51) Int. Cl.
- *H01L 21/02* (2006.01)
- *H01L 21/425* (2006.01)
- *H01L 21/441* (2006.01)
- *H01L 21/768* (2006.01)
- *H01L 23/522* (2006.01)
- *H01L 27/12* (2006.01)
- *H01L 29/06* (2006.01)
- *H01L 29/24* (2006.01)
- *H01L 29/66* (2006.01)

(52) U.S. Cl.
CPC ...... *H01L 21/441* (2013.01); *H01L 21/76829* (2013.01); *H01L 21/76877* (2013.01); *H01L 23/5226* (2013.01); *H01L 27/124* (2013.01); *H01L 27/127* (2013.01); *H01L 27/1225* (2013.01); *H01L 29/0684* (2013.01); *H01L 29/24* (2013.01); *H01L 29/66969* (2013.01); *H01L 29/78696* (2013.01); *H01L 2924/0002* (2013.01)

(58) Field of Classification Search
CPC .............. H01L 29/24; H01L 29/66969; H01L 29/7869; H01L 29/0604
USPC ........................................... 257/43; 438/104
See application file for complete search history.

(56) References Cited

U.S. PATENT DOCUMENTS

| | | | |
|---|---|---|---|
| 8,012,794 B2* | 9/2011 | Ye | H01L 21/02521 257/43 |
| 8,013,339 B2* | 9/2011 | Shih | H01L 29/4908 257/327 |
| 8,164,090 B2* | 4/2012 | Iwasaki | H01L 29/7869 257/43 |
| 8,384,076 B2* | 2/2013 | Park | H01L 29/78621 257/347 |
| 8,421,081 B2* | 4/2013 | Kato | G11C 11/404 257/292 |
| 8,802,515 B2* | 8/2014 | Endo | H01L 29/78618 438/162 |
| 8,860,023 B2* | 10/2014 | Tsubuku | H01L 29/66969 257/268 |
| 8,883,556 B2* | 11/2014 | Yamazaki | H01L 27/10873 257/43 |
| 8,927,982 B2* | 1/2015 | Koezuka | H01L 29/7869 257/43 |
| 8,946,790 B2* | 2/2015 | Yokoi | H01L 21/02554 257/288 |
| 9,123,750 B2 | 9/2015 | Park et al. | |
| 9,299,851 B2* | 3/2016 | Endo | H01L 29/7869 |
| 9,349,849 B2* | 5/2016 | Tanaka | H01L 29/78 |
| 9,577,109 B2* | 2/2017 | Shin | H01B 1/08 |
| 2008/0224133 A1* | 9/2008 | Park | H01L 21/02554 257/43 |
| 2008/0303037 A1* | 12/2008 | Irving | B82Y 10/00 257/88 |
| 2010/0090215 A1* | 4/2010 | Lee | H01L 29/7869 257/43 |
| 2010/0140611 A1* | 6/2010 | Itagaki | H01L 29/7869 257/43 |
| 2011/0097844 A1* | 4/2011 | Takechi | H01L 29/4908 438/104 |
| 2012/0003795 A1* | 1/2012 | Noda | H01L 29/78618 438/158 |
| 2012/0132904 A1* | 5/2012 | Yamazaki | H01L 21/02422 257/43 |
| 2012/0223303 A1* | 9/2012 | Ye | H01L 29/41733 257/43 |
| 2013/0140551 A1* | 6/2013 | Park | B32B 3/26 257/43 |
| 2013/0193432 A1* | 8/2013 | Yamazaki | H01L 29/7869 257/43 |
| 2014/0001464 A1* | 1/2014 | Park | H01L 29/66969 257/43 |
| 2014/0014947 A1* | 1/2014 | Yamazaki | H01L 29/7869 257/43 |
| 2014/0151690 A1 | 6/2014 | Kim et al. | |
| 2014/0159035 A1* | 6/2014 | Park | H01L 29/66969 257/43 |
| 2015/0034942 A1* | 2/2015 | Kim | H01L 29/7869 257/43 |
| 2015/0060990 A1* | 3/2015 | Kim | H01L 29/7869 257/324 |

OTHER PUBLICATIONS

Barnes et al., "A comparison of plasma-activated N2/O2 and N2O/O2 mixtures for use in ZnO:N synthesis by chemical vapor deposition", Journal of Applied Physics 96 (2004) 7036.*
Zhang et al., "Top-Gate Thin Film Transistor with ZnO:N Channel Fabricated by Room Temperature RF Magnetron Sputtering", SID 2014 Digest (2014) pp. 1024-1027.*
International Search Report of PCT/CN2014/091912 in Chinese, dated May 6, 2015 with English translation.
Notice of Transmittal of the International Search Report of PCT/CN2014/091912 in Chinese, dated May 6, 2015.
Written Opinion of the International Searching Authority of PCT/CN2014/091912 in Chinese, dated May 6, 2015 with English translation.
Chinese Office Action in Chinese Application No. 201410381242.X, dated Jun. 28, 2016 with English translation.
Second Chinese Office Action in Chinese Application No. 201410381242.X, dated Feb. 24, 2017 with English translation.
Lee, Eunha et al. (2014) "Nanocrystalline ZnON; High mobility and low band gap semiconductor material for high performance switch transistor and image sensor application." Scientific Reports, 4 : 4948, pp. 1-7.

* cited by examiner nitrogen ion implantation

THIN FILM TRANSISTOR, MANUFACTURING METHOD THEREOF, ARRAY SUBSTRATE AND DISPLAY APPARATUS

CROSS REFERENCE TO RELATED APPLICATIONS

This application is the National Stage of PCT/CN2014/091912 filed on Nov. 21, 2014, which claims priority under 35 U.S.C. § 119 of Chinese Application No. 201410381242.X filed on Aug. 5, 2014, the disclosure of which is incorporated by reference.

TECHNICAL FIELD

Embodiments of the present invention relate to a thin film transistor, a manufacturing method thereof, an array substrate and a display apparatus.

BACKGROUND

Since thin film transistors (TFTs) have good switching characteristics, now they have been widely used in flat panel display apparatus. Typically, a thin film transistor includes a gate electrode, an active region, a source electrode and a drain electrode with the source and drain electrodes being disposed on both ends of the active region and in contact with the active region. For example, when gate voltage is higher than threshold voltage, the source electrode and the drain electrode are in electric conduction through the active region, and carriers flow from the source electrode to the drain electrode or from the drain electrode to the source electrode.

The active region of a thin film transistor usually uses ZnON (zinc nitrogen oxide) material, which, compared to IGZO (indium gallium zinc oxide) material, has nitrogen voids with relatively higher mobility during electric conduction, in this way the conduction performance of the thin film transistor can be greatly improved. In addition, since ZnON material is cheaper than IGZO material, the manufacturing cost of the thin film transistor can be greatly reduced by using ZnON material as the active region.

However, different contents of nitrogen element in ZnON material result in different mobilities, and during the period in which the thin film transistor is turned on and during the annealing process of ITO (Indium Tin Oxide) of the display substrate (e.g. an array substrate) of a display apparatus, the nitrogen element in the active region migrates to the adjacent gate insulating layer or passivation layer due to diffusion effects, which reduces the mobility of nitrogen voids in the active region, and thus increases the sub-threshold swing amplitude of the thin film transistor, the increase of the sub-threshold swing amplitude has a strong impact on the semiconductor characteristics of the thin film transistor.

SUMMARY

Embodiments of the present invention provide a thin film transistor, a manufacturing method thereof, an array substrate and a display apparatus.

At least one embodiment of the present invention provides a method for manufacturing a thin film transistor. The method includes forming a gate electrode, a gate insulating layer, an active region, a source electrode and a drain electrode on a base substrate with the active region being formed of ZnON material, and implanting the active region with nitrogen ion while it being formed, to make the sub-threshold swing amplitude of the thin film transistor less than or equal to 0.5 mV/dec.

For example, the active region comprises a first active region layer and a second active region layer.

For example, implanting the active region with nitrogen ion upon forming the active region includes: forming the first active region layer by depositing ZnON material; implanting the first active region layer with nitrogen ion with the implantation dose being $10^{11}$-$10^{12}$ nitrogen ions per square centimeter; and forming the second active region layer by depositing ZnON material.

For example, the thickness of the first active region layer may be within the range of 100 Å-200 Å, while the thickness of the second active region layer may be within the range of 300 Å-400 Å.

For example, the above-mentioned method may further include forming an etching stop layer after the formation of the active region and before the formation of the source electrode and the drain electrode, and forming a first via hole and a second via hole corresponding to both ends of the active region respectively in the etching stop layer, wherein the source electrode is connected to the active region through the first via hole and the drain electrode is connected to the active region through the second via hole.

For example, the active region is formed over the gate electrode, or the gate electrode is formed over the active region.

Embodiments of the present invention further provide a thin film transistor that is formed by any of the above-mentioned manufacturing methods.

For example, the active region of the thin film transistor includes a first active region layer and a second active region layer, and the concentration of the nitrogen ion at an effective conducting site of the first active region layer is higher than that at an effective conducting site of the second active region layer.

For example, the thin film transistor further includes an etching stop layer provided between the active region and the source and drain electrodes, wherein a first via hole and a second via hole are provided in the regions corresponding to both ends of the active region respectively; the source electrode is connected to the active region through the first via hole and the drain electrode is connected to the active region through the second via hole.

Embodiments of the present invention further provide an array substrate including any of the above-mentioned thin film transistors.

Embodiments of the present invention further provide a display apparatus including any of the above-mentioned array substrates.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Figure 1:
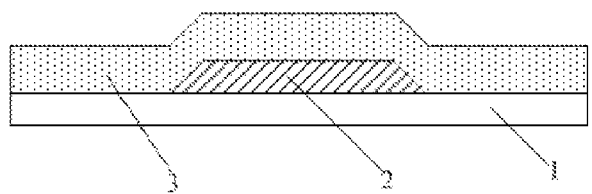
FIG. 1 illustrates a step for forming a gate electrode and a gate insulating layer in embodiment 1 of the present invention.

REFERENCE NUMERALS 1. base substrate; 2. gate electrode; 3. gate insulating layer; 4. active region; 41. first active region layer; 42. second active region layer; 5. source electrode; 6. drain electrode; 7. etching stop layer; 8. first via hole; 9. second via hole.

DETAILED DESCRIPTION

To make the technical solutions of the present invention better understood by those skilled in the art, the thin film transistor, manufacturing method thereof, array substrate and display apparatus provided in the present invention will be described in more detail in the following in combination with the accompanying drawings and the detailed description of embodiments. It is obvious that the embodiments to be described are only some, not all, of the embodiments of the present invention. Based on the described embodiments herein, other embodiment(s) obtained by those skilled in the art without any inventive work should be within the scope of the invention.

Embodiment 1

The present embodiment provides a method for manufacturing a thin film transistor. As shown in FIGS. 1-6, the method includes forming a gate electrode 2, a gate insulating layer 3, an active region 4, a source electrode 5 and a drain electrode 6 on a base substrate 1 with the active region 4 being formed of ZnON material, and implanting nitrogen ion into the active region 4 upon forming the active region 4, to make the sub-threshold swing amplitude of the thin film transistor less than or equal to 0.5 mV/dec.

The sub-threshold swing amplitude refers to the slope of the segment from off state (turned off state) to on state (turned on state) of a semiconductor output characteristic curve. The smaller the slope is, the faster the thin film transistor responds from off state to on state and accordingly the better the sub-threshold swing amplitude characteristic is and the better the performance of the thin film transistor is; the larger the slope is, the slower the thin film transistor responds from off state to on state, and accordingly the poorer the sub-threshold swing amplitude characteristic is and the poorer the performance of the thin film transistor is.

In this embodiment, the active region 4 is formed over the gate electrode 2, and the gate electrode 2, the gate insulating layer 3, the active region 4, the source electrode 5 and the drain electrode 6 are formed in this order on the base substrate 1. That is to say, the thin film transistor in the present embodiment is of a bottom gate structure. For example, the gate electrode 2, the gate insulating layer 3, the source electrode 5 and the drain electrode 6 may be formed by a traditional patterning process, which will need not to be further detailed here.

In this embodiment, the active region 4 may have a two-layer structure including, for example, a first active region layer 41 and a second active region layer 42. In an example, implanting nitrogen ion into the active region 4 upon forming the active region 4 is performed as follows.

Figure 2:
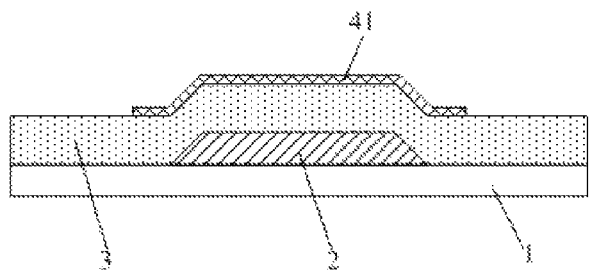
FIG. 2 illustrates a step for forming a first active region layer in embodiment 1 of the present invention.

In step S1, the first active region layer 41 is formed by depositing ZnON material (as shown in FIG. 2).

Figure 3:
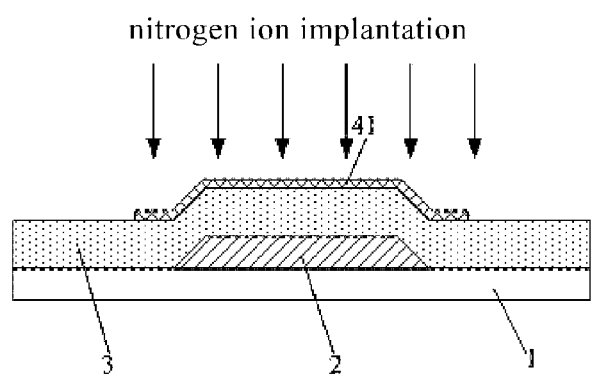
FIG. 3 illustrates a step for implanting nitrogen ion into the first active region layer in embodiment 1 of the present invention.

In step S2, the first active region layer 41 is implanted with nitrogen ion, and the implantation dose may be $10^{11}$-$10^{12}$ nitrogen ions per square centimeter (as shown in FIG. 3).

The implantation dose of nitrogen ion can increase the concentration of the nitrogen ion at an effective conducting site of the active region 4, which can further increase the mobility of nitrogen voids in the active region 4, and thus further increase the mobility of carriers in the active region 4, thereby reducing the sub-threshold swing amplitude of the thin film transistor and thus improving the semiconductor characteristics of the thin film transistor.

Figure 4:
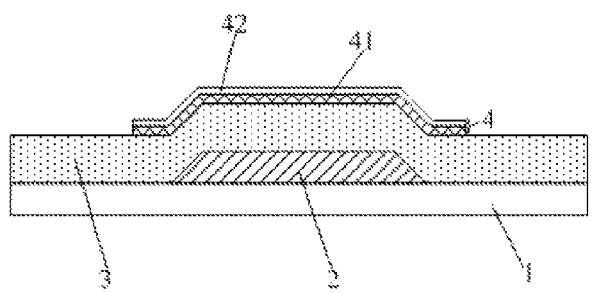
FIG. 4 illustrates a step for forming a second active region layer in embodiment 1 of the present invention.

In step S3, the second active region layer 42 is formed by depositing ZnON material (as shown in FIG. 4).

The second active region layer 42 is in direct contact with the source electrode and the drain electrode and acts as the conducting layer of the active region 4 during operation. When the thin film transistor is in an operation, the second active region layer 42 as the conducting layer may have nitrogen ion therein diffused into the adjacent gate insulating layer or passivation layer due to diffusion effects, which reduces the mobility of nitrogen voids in the second active region layer 42. The concentration of nitrogen ion at an effective conducting site of the first active region layer 41 is higher than that at an effective conducting site of the second active region layer 42. When the thin film transistor is in operation (including being in a linear state or a saturation state), nitrogen ions in the first active region layer 41 will be supplied to the second active region layer 42 and stay at the effective conducting sites of the second active region layer 42. The increase of the concentration of nitrogen ion at effective conducting sites will further increase the mobility of the nitrogen voids in the second active region layer 42, i.e. further increase the mobility of carriers in the active region 4, thereby the sub-threshold swing amplitude of the thin film transistor is reduced, and thereby the semiconductor characteristics of the thin film transistor are improved.

Alternatively, both of the first active region layer 41 and the second active region layer are implanted with nitrogen ion and, for instance, their implantation concentrations of nitrogen ion may be different.

It is to be noted that, an effective conducting site refers to a site of an effective void in the active region 4 of ZnON material. When the thin film transistor is powered on, the nitrogen element at the sites of effective voids is driven away from the sites rapidly by the gate electric field, so that the sites of effective voids are vacated and thus the active region 4 can fulfill semi-void conduction rapidly. This enable the powered on thin film transistor to be turned on rapidly, i.e. to evolve from off state to on state rapidly, which both reduces the sub-threshold swing amplitude of the thin film transistor, and improves the semiconductor characteristics of the thin film transistor.

For example, the thickness of the first active region layer 41 may be within the range of 100 Å-200 Å, the thickness of the second active region layer 42 may be within the range of 300 Å-400 Å. In such a configuration, a quantity of nitrogen ion are stored in the first active region layer 41 by implantation of nitrogen ion, and at the same time the mobility of nitrogen voids in the second active region layer 42 is increased during conduction because of the increase of the concentration of nitrogen ion at effective conducting sites, i.e. the mobility of carriers in the active region 4 is further increased, thereby the sub-threshold swing amplitude of the thin film transistor is reduced and thereby the semiconductor characteristics of the thin film transistor are improved.

Figure 5:
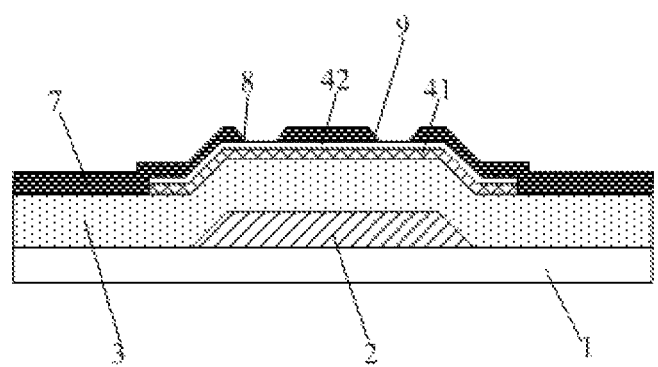
FIG. 5 illustrates a step for forming an etching stop layer, a first via hole and a second via hole in embodiment 1 of the present invention.
Figure 6:
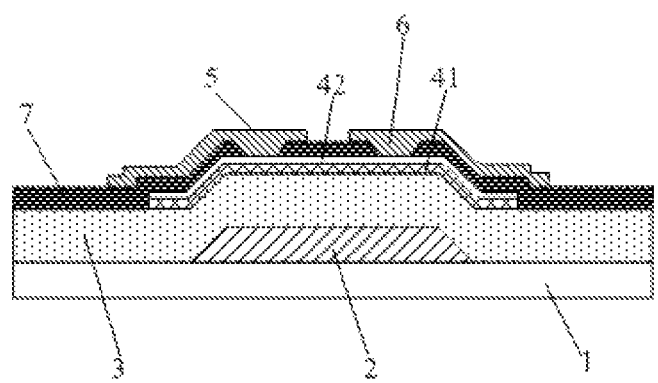
FIG. 6 illustrates a step for forming a source electrode and a drain electrode in embodiment 1 of the present invention.

For example, in this embodiment, an etching stop layer 7 may be additionally formed after the formation of the active region 4 and before the formation of the source electrode 5 and the drain electrode 6 (as shown in FIG. 6). In the etching stop layer 7, a first via hole 8 and a second via hole 9 corresponding to both ends of the active region 4 respectively are formed (as shown in FIG. 5). The source electrode 5 is connected to the active region 4 through the first via hole 8, while the drain electrode 6 is connected to the active region 4 through the second via hole 9. The etching stop layer 7 can protect the active region 4 from being damaged by etching when the source electrode 5 and the drain electrode 6 are being formed through etching.

It is to be noted that, an etching stop layer may be not formed between the active region 4 and the source and drain electrodes 5, 6, so long as the active region 4 is ensured not to be damaged by etching when the source electrode 5 and the drain electrode 6 are being formed through etching.

Embodiment 2

The present embodiment provides a method for manufacturing a thin film transistor, in which the gate electrode is formed over the active region, i.e. the thin film transistor formed in the present embodiment is of a top gate structure, as is different from embodiment 1.

The fabricating method of other structures of the thin film transistor in the present embodiment is the same as that in embodiment 1, which will not be further detailed here.

For example, when the active region has a two-layer structure, the layer in direct contact with the source and drain electrodes is not implanted with nitrogen ion, while the layer not in contact with the source and drain electrodes is implanted with nitrogen ion; or both of the layers are implanted with nitrogen ion and for example their implantation concentrations of nitrogen ion may be different.

In the methods for manufacturing a thin film transistor provided in embodiments 1 and 2, the concentration of nitrogen ion at effective conducting sites in the active region is greatly increased by implanting the active region with nitrogen ion upon forming the active region. Therefore, when the thin film transistor is in operation, the loss of nitrogen element due to diffusion effects in the active region can be compensated sufficiently. As a result, the mobility of nitrogen voids in the active region is greatly increased, i.e. the mobility of carriers in the active region is greatly increased, thereby the sub-threshold swing amplitude of the thin film transistor is reduced and the semiconductor characteristics of the thin film transistor are improved.

Embodiment 3

The present embodiment provides a thin film transistor, which may be formed by any manufacturing method in embodiments 1-2.

For example, in the present embodiment, the active region of the thin film transistor may include a first active region layer and a second active region layer, for example, the second active region layer is provided on the first active region layer. The concentration of nitrogen ion at effective conducting sites in the first active region layer is higher than that at effective conducting sites in the second active region layer. In such a configuration, when the thin film transistor is in operation, nitrogen ions in the first active region layer will be supplied to the second active region layer and stay at effective conducting sites in the second active region layer. As a result, the mobility of nitrogen voids in the whole active region is greatly increased, i.e. the mobility of carriers in the active region is further increased, thereby the sub-threshold swing amplitude of the thin film transistor is reduced and thereby the semiconductor characteristics of the thin film transistor are improved.

For example, in this embodiment, the thin film transistor may further include an etching stop layer between the active region and the source and drain electrodes. In the etching stop layer, a first via hole and a second via hole are opened in the regions corresponding to both ends of the active region respectively. The source electrode is connected to the active region through the first via hole, while the drain electrode is connected to the active region through the second via hole. The etching stop layer can protect the active region from being damaged by etching when the source and drain electrodes are being formed through etching.

In the thin film transistor formed by any manufacturing method in embodiments 1-2, the sub-threshold swing amplitude is less than or equal to 0.5 mV/dec, i.e. the sub-threshold swing amplitude is greatly reduced, so that the semiconductor characteristics are greatly improved.

Embodiment 4

The present embodiment provides an array substrate, which includes any thin film transistor described in embodiment 3.

With any thin film transistor described in embodiment 3, a performance of the array substrate is further improved. In the array substrate provided in the embodiment of the present invention, the performance is further improved by using any thin film transistor described in embodiment 3.

Embodiment 5

The present embodiment provides a display apparatus including any array substrate described in embodiment 4.

With any array substrate described in embodiment 4, a performance of the display apparatus is further improved.

For example, the display apparatus provided in the embodiment of the present invention may be any product or component with display functionality, such as a liquid crystal panel, a liquid crystal television, a display, an OLED panel, an OLED television, a cell phone, a navigator or a watch. In the display apparatus provided in the embodiment of the present invention, the performance is further improved by using any array substrate described in embodiment 4.

What are described above is related to the illustrative embodiments of the disclosure only and not limitative to the scope of the disclosure; the scopes of the disclosure are defined by the accompanying claims.

The present application claims priority of China patent application No. 201410381242.X filed on Aug. 5, 2014, which is incorporated herein in its entirety by reference as a part of the present application.

What is claimed is:

1. A method for manufacturing a thin film transistor, the method comprising:
   forming a gate electrode, a gate insulating layer, an active region, a source electrode and a drain electrode on a base substrate, wherein forming the active region comprises:
  forming a first active region layer by depositing ZnON material;
  implanting the first active region layer with nitrogen ion with an implantation dose of $10^{11}$-$10^{12}$ nitrogen ions per square centimeter; and then
  forming a second active region layer by depositing ZnON material,
wherein the first active region layer and the second active region layer are coextensive with each other.

2. The method according to claim 1, wherein the first active region layer has a thickness of 100Å-200Å, and the second active region layer has a thickness of 300Å-400Å.

3. The method according to claim 1, further comprising:
  forming an etching stop layer after the active region is formed and before the source electrode and the drain electrode are formed, and
  forming a first via hole and a second via hole corresponding to both ends of the active region respectively in the etching stop layer,
  wherein the source electrode is connected to the active region through the first via hole, and the drain electrode is connected to the active region through the second via hole.

4. The method according to claim 1, wherein the active region is formed over the gate electrode; or the gate electrode is formed over the active region.

* * * * *